(12) United States Patent
Yan et al.

(10) Patent No.: US 9,812,204 B1
(45) Date of Patent: Nov. 7, 2017

(54) FERROELECTRIC MEMORY CELL WITHOUT A PLATE LINE

(71) Applicant: AUCMOS Technologies USA, Inc., Santa Clara, CA (US)

(72) Inventors: Tianhong Yan, Saratoga, CA (US); Yung-Tin Chen, Santa Clara, CA (US)

(73) Assignee: AUCMOS Technologies USA, Inc., Santa Clara, CA (US)

( * ) Notice: Subject to any disclaimer, the term of this patent is extended or adjusted under 35 U.S.C. 154(b) by 0 days.

(21) Appl. No.: 15/391,982

(22) Filed: Dec. 28, 2016

Related U.S. Application Data

(60) Provisional application No. 62/414,530, filed on Oct. 28, 2016.

(51) Int. Cl.
| | | |
|---|---|---|
| *G11C 11/00* | (2006.01) | |
| *G11C 14/00* | (2006.01) | |
| *H01L 27/11* | (2006.01) | |
| *H01L 27/11502* | (2017.01) | |

(52) U.S. Cl.
CPC ...... *G11C 14/0072* (2013.01); *H01L 27/1104* (2013.01); *H01L 27/11502* (2013.01)

(58) Field of Classification Search
CPC .................................................. G11C 11/221
USPC ........................................................ 365/145
See application file for complete search history.

(56) References Cited

U.S. PATENT DOCUMENTS

| | | | | |
|---|---|---|---|---|
| 6,587,368 B1* | 7/2003 | Chen | ...................... | G11C 11/22 365/149 |
| 6,707,702 B1* | 3/2004 | Komatsuzaki | ......... | G11C 14/00 365/145 |
| 6,738,281 B2* | 5/2004 | Yokozeki | ........... | G11C 14/0072 365/145 |
| 7,133,306 B2* | 11/2006 | Suzuki | .................... | G11C 11/22 365/145 |
| 8,441,833 B2* | 5/2013 | Summerfelt | ............ | G11C 11/22 365/145 |
| 8,854,858 B2* | 10/2014 | Bartling | ................ | G11C 11/419 365/117 |
| 2003/0123276 A1* | 7/2003 | Yokozeki | ........... | G11C 14/0072 365/145 |
| 2005/0190597 A1* | 9/2005 | Kato | ....................... | G11C 11/22 365/185.08 |
| 2014/0210535 A1* | 7/2014 | Bartling | ................ | G11C 11/419 327/199 |

* cited by examiner

*Primary Examiner* — Son Mai
(74) *Attorney, Agent, or Firm* — VLP Law Group LLP

(57) ABSTRACT

A ferroelectric static random access memory (FeSRAM) cell includes (a) first and second cross-coupled inverters connected between a power supply voltage signal and a ground reference voltage signal and holding a data signal represented in a complementary manner in first and second common data terminals; (b) first and second select transistors coupled respectively to the first and second common data terminals of the cross-coupled inverters; and (c) first, second, third and fourth ferroelectric capacitors, wherein the first and second ferroelectric capacitors couple the first common data terminal to the power supply voltage signal and the ground reference voltage signal, respectively, and wherein the third and the fourth ferroelectric capacitors couple the second common data terminal to the power supply voltage signal and the ground reference voltage signal, respectively.

4 Claims, 7 Drawing Sheets

FERROELECTRIC MEMORY CELL WITHOUT A PLATE LINE

CROSS REFERENCE TO RELATED APPLICATIONS

The present application relates to and claims priority of U.S. provisional patent application ("Provisional Patent Application"), Ser. No. 62/414,530, entitled "Plateline-less Ferroelectric Memory Cell Structure," filed on Oct. 28, 2016. The disclosure of the Provisional Patent Application is hereby incorporated by reference in its entirety.

BACKGROUND OF THE INVENTION

1. Field of the Invention

The present invention relates to non-volatile memory circuits. In particular, the present invention relates to non-volatile memory circuits that use ferroelectric material for persistent storage.

2. Discussion of the Related Art

Memory circuits using ferroelectric materials (e.g., lead zirconate Titanate (PZT)) have been proposed. One type of such memory circuit is simply a capacitor, such as that ferroelectric capacitor 100 of FIG. 1(c). As shown in FIG. 1(c), ferroelectric capacitor 100 includes a layer of ferroelectric material provided between two capacitor plates represented by electrodes formed between a "plate line" (PL) and a "bit line" (BL), respectively.

Ferroelectric capacitor 100 of FIG. 1(c) may be used in one of two ways: (i) as non-volatile memory cell, or as (ii) a volatile memory cell. FIG. 1(a) illustrates the programmed states of ferroelectric capacitor 100 when used as a non-volatile memory cell. As shown in FIG. 1(a), when used as a non-volatile cell, a high programming voltage (e.g., $V_{PP}$, where $V_{PP}$ may be 5 v volts, for example) is applied across ferroelectric capacitor 100 to program ferroelectric capacitor 100 into a first phase or programmed state, representing the stored data bit "0". After the imposed voltage across ferroelectric capacitor 100 is removed, the ferroelectric material in ferroelectric capacitor 100 maintains the programmed "0" state for a long time (e.g., tens of years). Alternatively, ferroelectric capacitor 100 may be programmed into a second phase or programmed state by applying a high negative voltage (e.g., $-V_{PP}$) across storage capacitor 100, representing the erased data bit "1". When the imposed voltage across capacitor 100 is removed, the ferroelectric material in storage capacitor 100 maintains the programmed "1" state for a long time (e.g., tens of years).

FIG. 1(b) illustrates the programmed states of ferroelectric capacitor 100 when used as a volatile memory cell. As shown in FIG. 1(b), when used as a volatile cell, a programming voltage (e.g., $V_{cc}$ e.g., 1 v) that is much lower than the programming voltage for the non-volatile state is applied across ferroelectric capacitor 100 to program ferroelectric capacitor 100 into a first phase or programmed state, representing the volatile data bit "0". When the imposed voltage across capacitor 100 is removed, the ferroelectric material in storage capacitor 100 maintains the programmed "0" state for a relatively much shorter time period (e.g., seconds) than those of the non-volatile states. Alternatively, ferroelectric capacitor 100 may be programmed into a second phase or programmed state by applying a corresponding negative voltage ($-V_{cc}$) across storage capacitor 100, representing the volatile data bit "1". When the imposed voltage across ferroelectric capacitor 100 is removed, the ferroelectric material in storage capacitor 100 maintains the programmed "1" sate for a relatively shorter period of time (e.g., seconds) than those of the non-volatile states.

The higher programming voltage in non-volatile memory cells operation may reduce the endurance of ferroelectric capacitor 100 and provides relatively slow read and write speeds. The low programming voltage for volatile operations allows greater endurance and higher read and write speeds (e.g., comparable to conventional dynamic random access memory (DRAM) speeds). However, in many applications, as in DRAM, ferroelectric capacitor 100 is required to be refreshed periodically to prevent data loss, albeit at a lesser frequency than conventional DRAMs.

FIG. 2(a) shows a ferroelectric static random access memory (FeSRAM) cell 200, which operate as a non-volatile memory cell. As shown in FIG. 2(a), FeSRAM cell 200 includes a conventional 6-transistor static random access memory (SRAM) cell formed by select transistors 201a and 201b, and cross-coupled inverters formed by transistors 202a, 202b, 203a and 203b. FeSRAM 200 also includes ferroelectric capacitors C0 and C1 respectively connected input terminals 204a and 204b of the cross-coupled inverters and the plate line carrying voltage signal PL. During operation, before FeSRAM cell is powered down, the complementary stored data bits of the SRAM cell held at terminals 204a and 204b are written into ferroelectric capacitors C0 and C1, respectively. When power is restored, the complementary data bits in ferroelectric storage capacitors C0 and C1 are written back into the SRAM cell (i.e., to be held at terminals 204a and 204b again).

FIG. 2(b) shows, when power is restored, voltage signal VPW at the power supply line of the SRAM cell, voltage signal PL on the plate line and voltage signals BT and BC at the input terminals 204a and 204b of the cross-coupled inverters of the SRAM cell. FIG. 2(c) shows, before FeSRAM cell 200 is powered down, voltage signal VPW at the power supply line of the SRAM cell, voltage signal PL on the plate line and voltage signals BT and BC at the input terminals of the cross-coupled inverters of the SRAM cell.

Initially, as shown in FIG. 2(c), voltage signal VPW is at $V_{CC}$, plate line signal PL is at 0.5 $V_{CC}$, and voltage signals BT and BC are at $V_{CC}$ and 0 volts, respectively. (Transistors 203a and 202b are conducting, and transistors 203b and 202a are non-conducting). To write these states into ferroelectric capacitors C0 and C1, both voltage signals VPW and PL are brought to programming voltage $V_{PP}$, thereby bringing the voltage across ferroelectric storage capacitor C1 to $V_{PP}$, thus writing bit '0' into capacitor C1. After ferroelectric storage capacitor C1 has been written, voltage PL on the plate line is brought to 0 volts, such that the voltage across ferroelectric storage capacitor C0 is brought to $-V_{PP}$, thereby writing bit '1' into capacitor C0. After ferroelectric storage capacitors C0 and C1 are both written, voltage VPW is also brought to 0 volts (i.e., powered down).

When power is restored, as shown in FIG. 2(b), voltage signal VPW is ramped up to $V_{CC}$, plate line signal PL is held at 0 volts. The stored voltages in ferroelectric storage capacitors C0 (at bit '1') and C1 (at bit '0') are sufficient to render transistors 203a and 202b conducting, and transistors 203b and 202a non-conducting. Accordingly, the voltage signals BT and BC at terminals 204a and 204b are brought to $V_{CC}$ and 0 volts, respectively. Thus, the SRAM cell is returned to its state prior to the power down. At this point, voltage PL is returned to 0.5 $V_{PP}$, which is its quiescent state. The subsequent operations of FeSRAM cell 200 are essentially those of a conventional SRAM cell.

As can be seen from the discussion above with respect to FIGS. 1(a) and 1(b), during normal operations, signal transitions at the input terminals of the cross-coupled inverters of the SRAM cells place ferroelectric storage capacitors C0 and C1 into their volatile states, and thus the resulting stored data are not preserved.

As voltage PL has signaling requirements that are different from either the power supply voltage VPW or the ground reference, it requires a separate decoder. The routing requirement also increases the size of FeSRAM cell 200 relative to the size of a corresponding conventional SRAM cell.

SUMMARY

According to one embodiment of the present invention, a ferroelectric static random access memory (FeSRAM) cell includes (a) first and second cross-coupled inverters connected between a power supply voltage signal and a ground reference voltage signal and holding a data signal represented in a complementary manner in first and second common data terminals; (b) first and second select transistors coupled respectively to the first and second common data terminals of the cross-coupled inverters; and (c) first, second, third and fourth ferroelectric capacitors, wherein the first and second ferroelectric capacitors couple the first common data terminal to the power supply voltage signal and the ground reference voltage signal, respectively, and wherein the third and the fourth ferroelectric capacitors couple the second common data terminal to the power supply voltage signal and the ground reference voltage signal, respectively.

In one embodiment, the first select transistor is formed at the surface of a semiconductor substrate, and the first and second ferroelectric capacitors are implemented between conductor layers above the select transistor within the silicon footprint of the first select transistor. The power supply voltage signal selectably provides a first voltage ("operating voltage") and a second voltage ("programming voltage") and wherein the programming voltage selectably programs one or more of the ferroelectric capacitors to non-volatile states. The operating voltage selectably programs one or more of the ferroelectric capacitors to volatile states.

The present invention is better understood upon consideration of the detailed description below, in conjunction with the accompanying drawings.

BRIEF DESCRIPTION OF THE DRAWINGS

To facilitate cross-referencing and to simplify the detailed description below, like elements in the figures are assigned like reference numerals.

DETAILED DESCRIPTION OF THE PREFERRED EMBODIMENTS

Figure 1A:
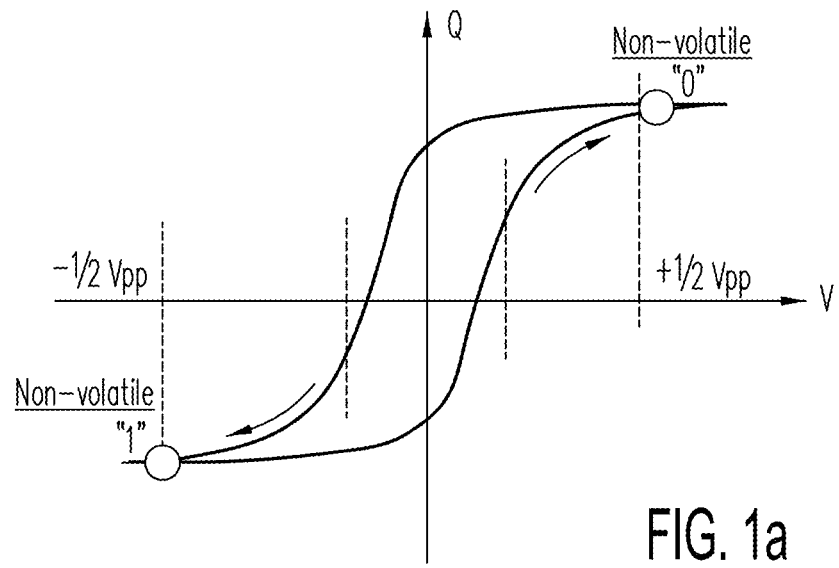
FIG. 1(a) illustrates the programmed states of storage operations of storage capacitor 100 when used as a non-volatile memory circuit.
Figure 1B:
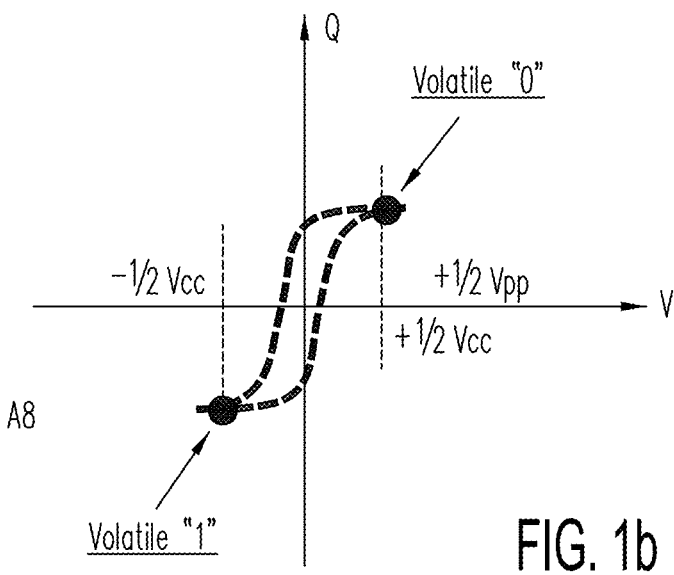
FIG. 1(b) illustrates the programmed states of storage operations of storage capacitor 100 when used as a volatile memory circuit
Figure 1C:
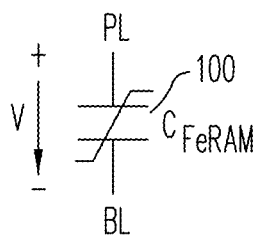
FIG. 1(c) shows storage capacitor 100, which is a simple model of a ferroelectric memory circuit.
Figure 2A:
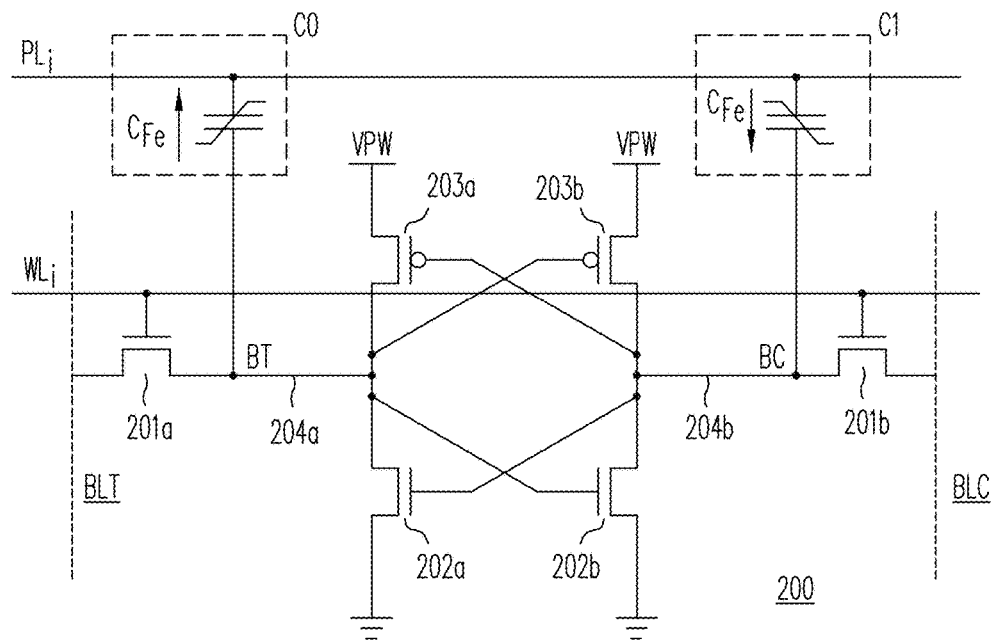
FIG. 2(a) shows a ferroelectric static random access memory (FeSRAM) cell 200, which operate as a non-volatile memory cell.
Figure 2B:
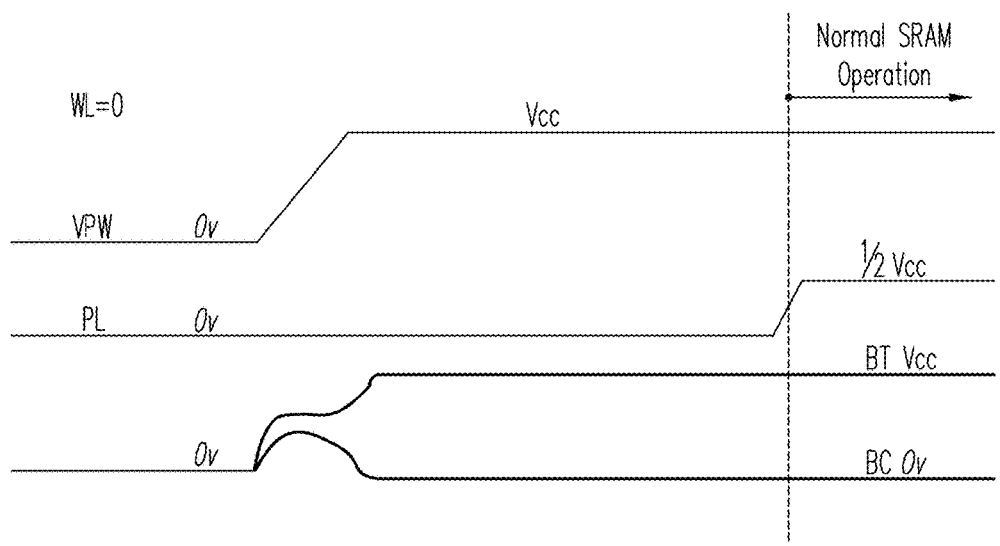
FIG. 2(b) shows, when power is restored, voltage signal VPW at the power supply line of the SRAM cell, voltage signal PL on the plate line and voltage signals BT and BC at the input terminals of the cross-coupled inverters of the SRAM cell.
Figure 2C:
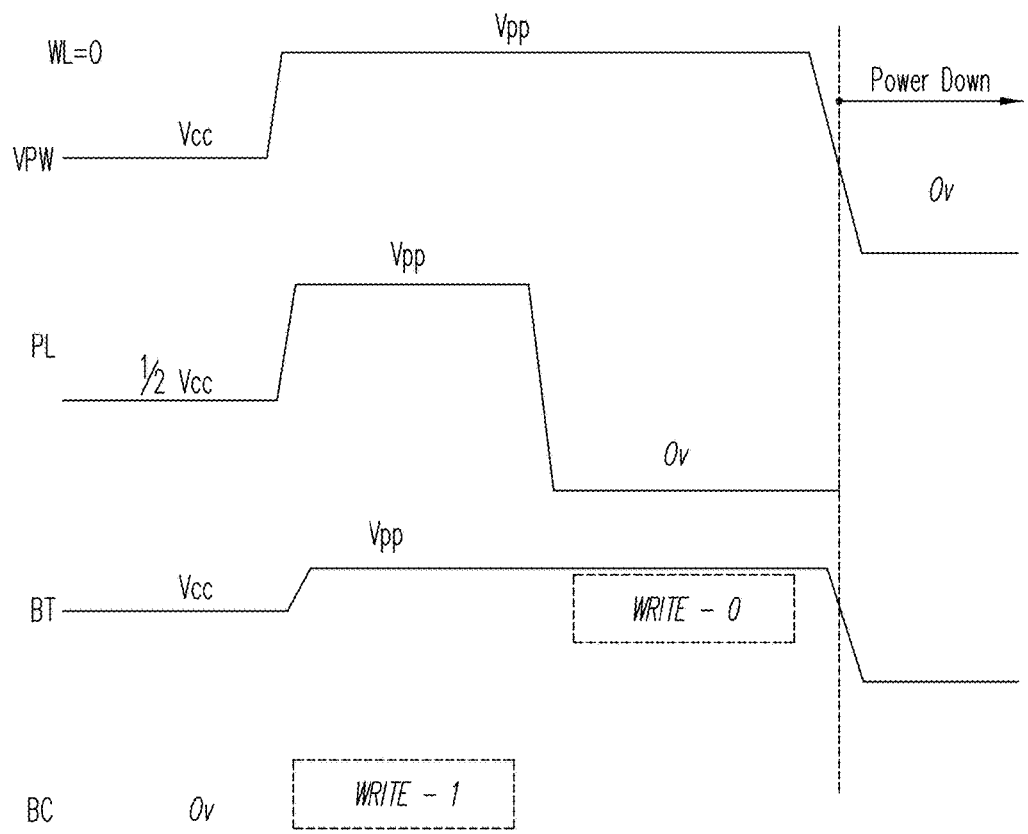
FIG. 2(c) shows, before FeSRAM cell 200 is powered down, voltage signal VPW at the power supply line of the SRAM cell, voltage signal PL on the plate line and voltage signals BT and BC at the input terminals of the cross-coupled inverters of the SRAM cell.

The present invention provides for the programming needs of an FeSRAM cell without requiring a plate line. FIG. 3(a) shows FeSRAM cell 300, in accordance with one embodiment of the present invention. As shown in FIG. 3, like FeSRAM cell 200 of FIG. 2, FeSRAM cell 300 includes a conventional 6-transistor SRAM cell. To simplify this detailed description, the transistors of the conventional SRAM cells in FeSRAM cells 200 and 300 are assigned like reference numerals. Unlike FeSRSAM cell 200, having two ferroelectric storage capacitors C0 and C1 connected to a plate line, FeSRAM cell 300 includes four ferroelectric storage capacitors C0U, C1U, C1D and C0D, without a plate line. Instead, ferroelectric storage capacitors C0U and C1U are coupled across power supply voltage VPW and cross-coupled inverter terminals 204a and 204b, respectively. Ferroelectric capacitors C1D and C0D are connected across cross-coupled inverter terminals 204a and 204b and the ground reference voltage ($V_{SS}$), FIG. 3(b) shows the operations to write the signal states at terminals 204a and 204b of the cross-coupled inverters into some of the ferroelectric capacitors C0U, C1U, C0D and C1D. In FIG. 3(b), initially, supply voltage VPW is at voltage $V_{CC}$, voltage BT is at voltage $V_{CC}$, while voltage BC is at 0 volts, suggesting that transistors 203a and 202b are conducting while transistors 203b and 202a are not conducting. As shown in FIG. 3(b), voltage VPW is brought to programming voltage $V_{PP}$, which in turn, brings terminal 204a to programming voltage $V_{PP}$ as well, while the voltage at terminal 204b remains at 0 volts. As a result, programming voltage $V_{PP}$ is imposed across ferroelectric capacitors C1D and C1U, thus writing ferroelectric capacitor C1D to the non-volatile "1" state and ferroelectric capacitor C1U to the non-volatile '0' state. As full programming voltage $V_{PP}$ does not appear across ferroelectric capacitors C0U and C0D in these operations, the states in ferroelectric capacitors C0U and C0D are volatile states and are lost upon powering down. The preceding description therefore corresponds to the case when terminal 204a is at the $V_{PP}$ and terminal 204b is at ground voltage at the time of writing into capacitor C1D and C1U. FIG. 4(a) summarizes this condition, pointing out that the programmed states at ferroelectric capacitors C0U and C0D are volatile and not preserved by the power down.

Figure 3C:
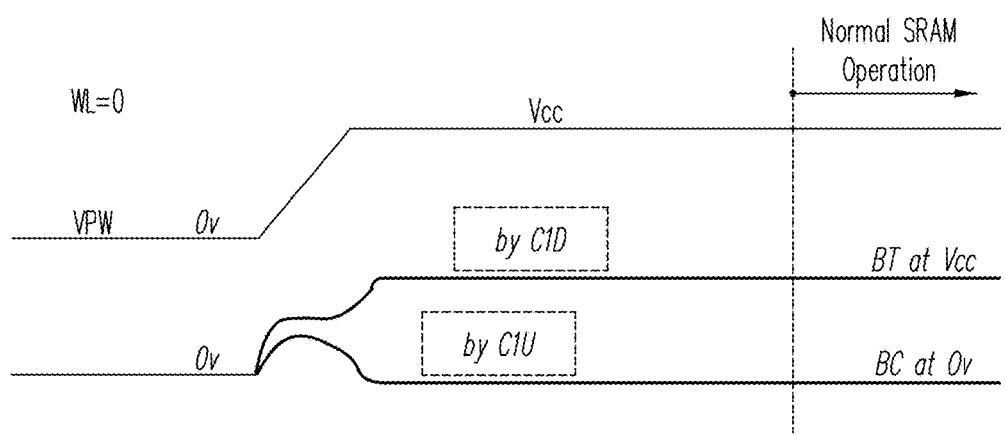
FIG. 3(c) shows, upon restoring power, the operations to restore the states of signals BT and BC at terminals 204a and 204b, respectively, according to one embodiment of the present invention.
Figure 3A:
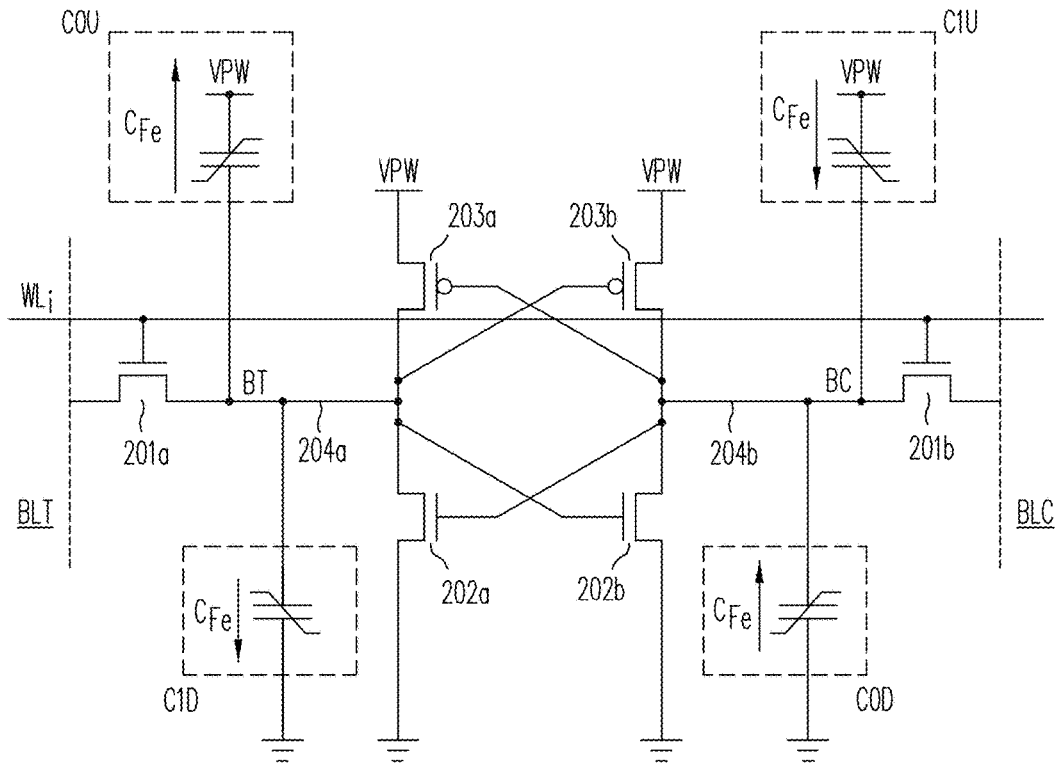
FIG. 3(a) shows FeSRAM cell 300, in accordance with one embodiment of the present invention.
Figure 3B:
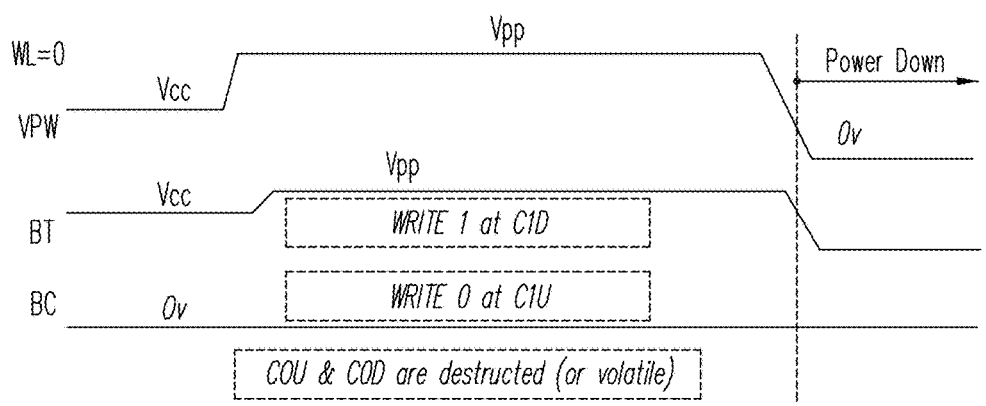
FIG. 3(b) shows the operations to write the signal states at terminals 204a and 204b of the cross-coupled inverters into some of the ferroelectric capacitors C0U, C1U, C0D and C1D.
Figure 4A:
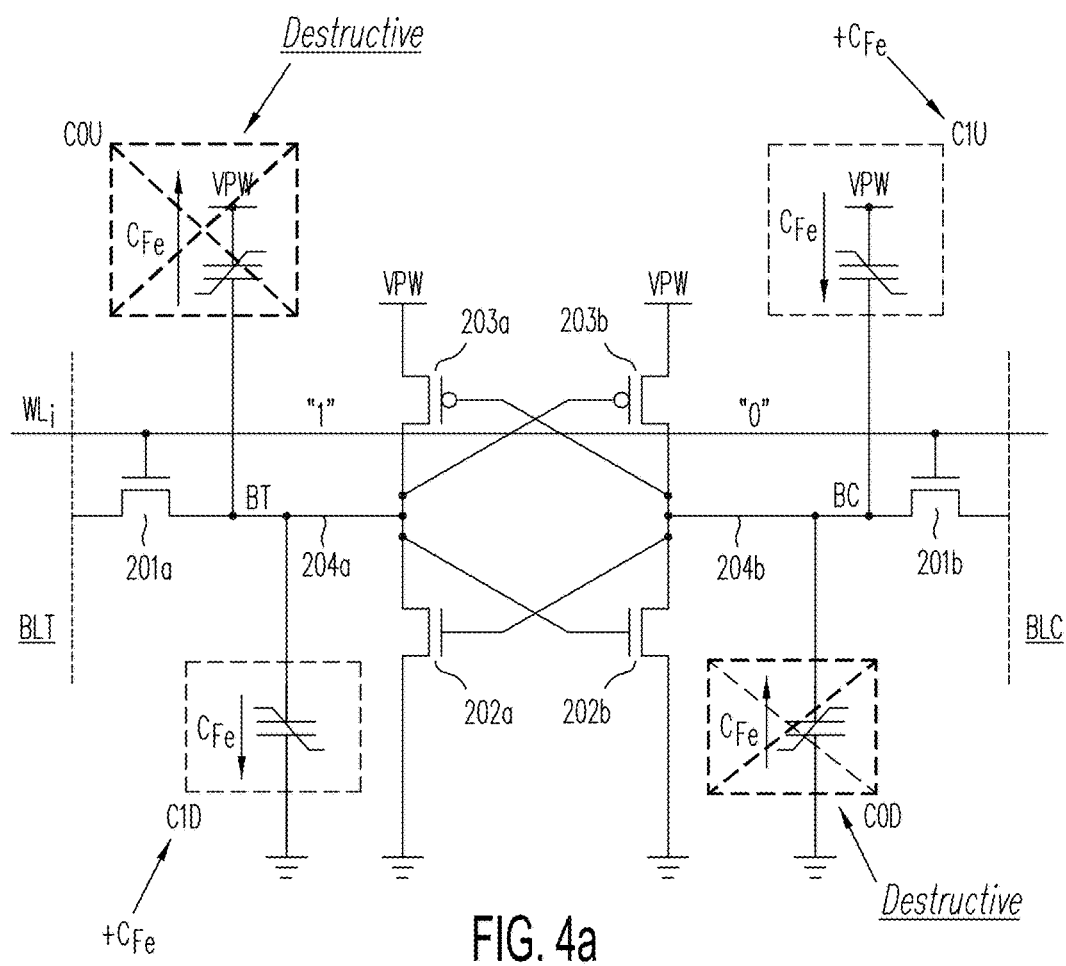
FIG. 4(a) summarizes storing non-volatile states in ferroelectric capacitors C1D and C1U of FeSRAM 300, when terminal 204a is at the $V_{PP}$ and terminal 204b is at ground voltage at the time of writing into the ferroelectric capacitors in preparation of powering down.

FIG. 3(c) shows, upon restoring power, the operations to restore the states of signals BT and BC at terminals 204a and 204b, respectively, according to one embodiment of the present invention. As shown in FIG. 3(c), when power is restored, the non-volatile states of ferroelectric capacitors C1U and C1D restore terminals 204a and 204b to $V_{CC}$ and 0 volts, respectively, thus restoring them to their previous states prior to powering down.

Figure 4B:
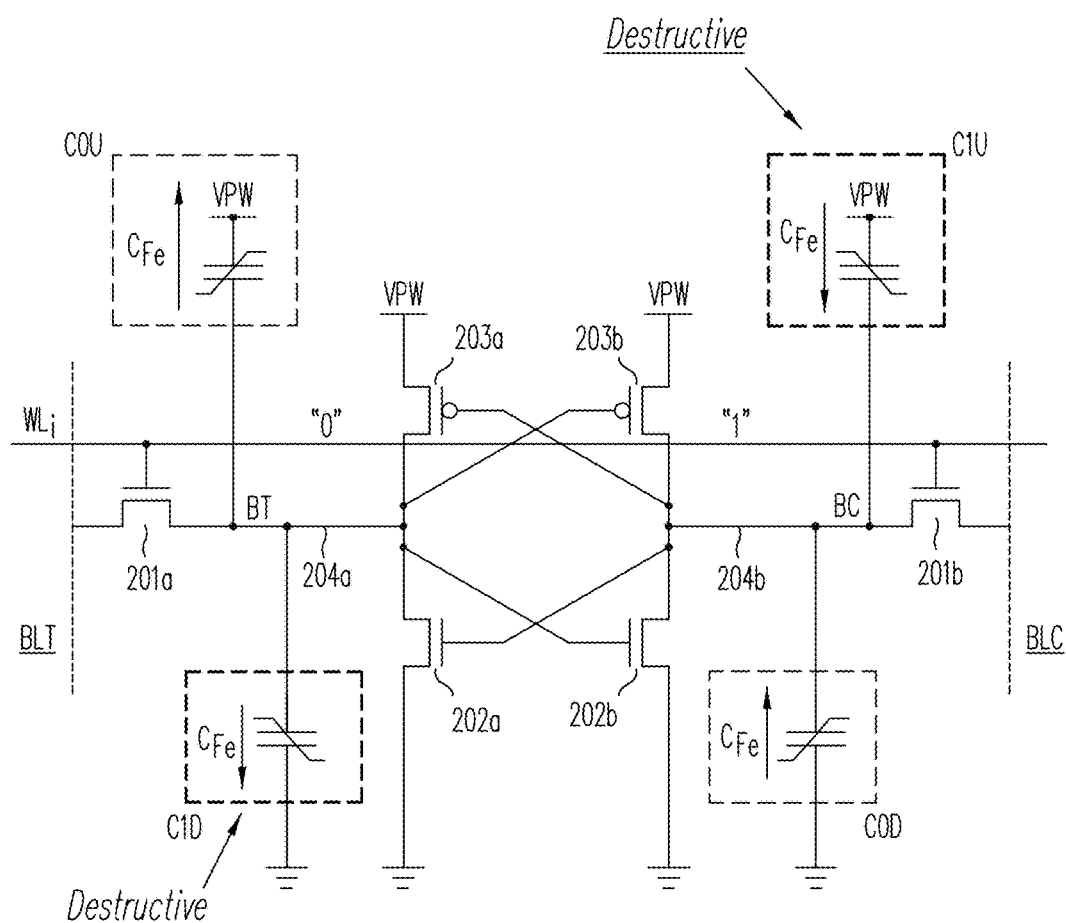
FIG. 4(b) summarizes storing non-volatile states in ferroelectric capacitors C0D and C0U of FeSRAM 300, when terminal 204b is at the $V_{PP}$ and terminal 204a is at ground voltage at the time of writing into the ferroelectric capacitors in preparation of powering down.

In the event that, at the time of programming non-volatile states into the ferroelectric capacitors, terminal 204b is at the $V_{PP}$ and terminal 204a is at ground voltage, non-volatile states would be written into ferroelectric capacitor C0U and C0D, and volatile states (that are not preserved by the power down) would be written into ferroelectric capacitors C1D and C1U. This condition is summarized in FIG. 4(b).

Figure 5A:
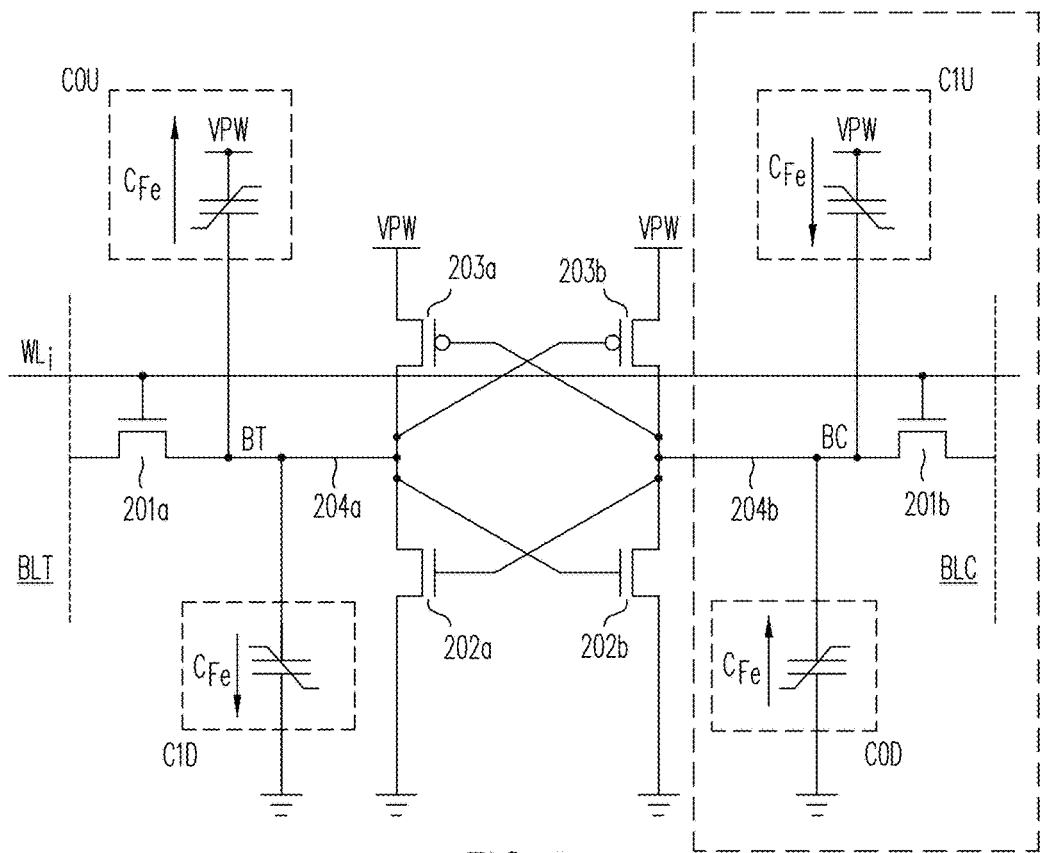
FIGS. 5(a) and 5(b) illustrate how select transistor 201b and ferroelectric capacitors C1U and C0D may be implemented on the same silicon footprint of select transistor 201b.
Figure 5B:
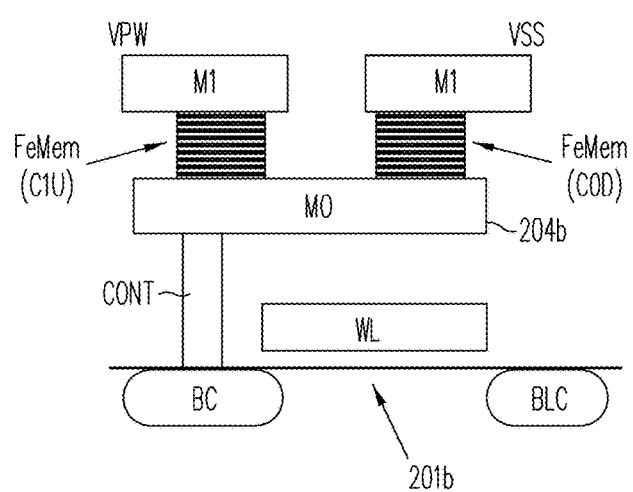

By eliminating the plate line, FeSRAM cell 300 may be provided at the same size as the conventional 6-transistor SRAM cell. This is achieved by providing the ferroelectric capacitors between conductor layers above the conventional 6-transistor SRAM cell. For example, FIGS. 5(a) and 5(b) illustrate how select transistor 201b and ferroelectric capacitors C1U and C0D (i.e., the combination shown in the dashed oval of FIG. 5(a)) may be implemented on the same silicon footprint of select transistor 201b. FIG. 5(b) shows select transistor 201b being implemented by gate electrode WL and source and drain regions BC and BLC separated by a channel region. Contact CONT connects source region BC to the common capacitor plate MO in a first conductor layer. The other capacitor plates of capacitor C1U and C0D are implemented on a second conductor layer separated by ferroelectric material. As shown in FIG. 5(c), power supply voltage VPW is routed to the capacitor plate of ferroelectric capacitor C1U at the second conductor level, while ground reference voltage $V_{SS}$ is routed to the capacitor plate of ferroelectric capacitor C0D at the second conductor level.

In addition to its compact size, a FeSRAM of the present invention also has the advantage of not having to provide a decoder for signal PL of the plate line, which is eliminated.

The above detailed description is provided to illustrate specific embodiments of the present invention and is not to be taken as limiting. Numerous variations and modifications within the scope of the present invention are possible. The present invention is set forth in the accompanying claims.

We claim:

1. A ferroelectric static random access memory (FeS-RAM) cell, capable of operating under a static random access memory (SRAM) phase and a ferroelectric capacitor programming phase, comprising:
    first and second cross-coupled inverters connected between a power supply voltage signal and a ground reference voltage signal and holding a data signal represented in a complementary manner in first and second common data terminals;
    first and second select transistors coupled respectively to the first and second common data terminals of the cross-coupled inverters; and
    first, second, third and fourth ferroelectric capacitors, wherein, during the SRAM phase, the first and second ferroelectric capacitors couple the first common data terminal to the power supply voltage signal and the ground reference voltage signal, respectively, and wherein the third and the fourth ferroelectric capacitors couple the second common data terminal to the power supply voltage signal and the ground reference voltage signal, respectively.

2. The FeSRAM cell of claim 1, wherein first select transistor is formed at the surface of a semiconductor substrate, and wherein the first and second ferroelectric capacitors are implemented between conductor layers above the select transistor within the silicon footprint of the first select transistor.

3. The FeSRAM cell of claim 1, wherein the power supply voltage signal selectably provides a first voltage and a second voltage and wherein the second voltage selectably programs one or more of the ferroelectric capacitors to a non-volatile state.

4. The FeSRAM cell of claim 3, wherein the first voltage selectably programs one or more of the ferroelectric capacitors to a volatile state.

* * * * *

UNITED STATES PATENT AND TRADEMARK OFFICE
CERTIFICATE OF CORRECTION

Page 1 of 1

PATENT NO. : 9,812,204 B1
APPLICATION NO. : 15/391982
DATED : November 7, 2017
INVENTOR(S) : Yan It is certified that error appears in the above-identified patent and that said Letters Patent is hereby corrected as shown below:

On the Title Page

Item (12) delete "Yan, et al." and insert -- Yan --.

Item (72) Inventors:
Should read:
--(72) Inventor: Tianhong Yan, Saratoga, (CA)--.

Signed and Sealed this
Twenty-fourth Day of September, 2019

Andrei Iancu
*Director of the United States Patent and Trademark Office*